(12) United States Patent
Fujiwara et al.

(10) Patent No.: US 11,101,422 B2
(45) Date of Patent: Aug. 24, 2021

(54) PYROELECTRIC INFRARED SENSOR DEVICE

(71) Applicant: TOKIN Corporation, Sendai (JP)

(72) Inventors: Shigemi Fujiwara, Sendai (JP);
Makoto Kaneko, Sendai (JP);
Masahiro Saito, Sendai (JP)

(73) Assignee: TOKIN CORPORATION, Sendai (JP)

( * ) Notice: Subject to any disclaimer, the term of this patent is extended or adjusted under 35 U.S.C. 154(b) by 2 days.

(21) Appl. No.: 15/649,888

(22) Filed: Jul. 14, 2017

(65) Prior Publication Data
US 2018/0026173 A1    Jan. 25, 2018

(30) Foreign Application Priority Data

Jul. 20, 2016   (JP) .............................. JP2016-142130

(51) Int. Cl.
*G01J 5/04*   (2006.01)
*H01L 37/02*   (2006.01)
(Continued)

(52) U.S. Cl.
CPC ............ *H01L 37/02* (2013.01); *G01J 5/0022* (2013.01); *G01J 5/0205* (2013.01); *G01J 5/04* (2013.01);
(Continued)

(58) Field of Classification Search
CPC ....... G01J 5/34; G01J 5/20; G01J 5/02; H01L 37/02; G08B 13/191
See application file for complete search history.

(56) References Cited

U.S. PATENT DOCUMENTS

| 4,745,284 A | * | 5/1988 | Masuda | ................. G08B 13/19 |
| | | | | 250/338.3 |
| 5,026,992 A | * | 6/1991 | Wong | .................. G01N 21/255 |
| | | | | 250/339.03 |

(Continued)

FOREIGN PATENT DOCUMENTS

| CN | 102625907 A | 8/2012 |
| CN | 104011517 A | 8/2014 |

(Continued)

OTHER PUBLICATIONS

<https://premium.ipros.jp/nec-tokin/product/detail/2000246310/?categoryId=27675>, Mar. 18, 2016.
(Continued)

*Primary Examiner* — David P Porta
*Assistant Examiner* — Mamadou Faye
(74) *Attorney, Agent, or Firm* — Snyder, Clark, Lesch & Chung, LLP

(57) ABSTRACT

A pyroelectric infrared sensor device comprising: a pyroelectric infrared sensor part (2); and a cover member (3). The pyroelectric infrared sensor part comprises: a pyroelectric element (21); a housing (24) that the pyroelectric element is placed inside of and comprises an opening at a position facing a light receiving surface of the pyroelectric element; and an infrared transmission filter (25) that is located to cover the opening of the housing. The cover member covers at least a top surface of the pyroelectric infrared sensor part. The infrared transmission filter transmits light equal to or greater than a wavelength of 1 μm. The cover member has a property that a transmittance of infrared light having a wavelength of from 3 μm to 5.5 μm is equal to or greater than 10% and has a uniform material quality in an area corresponding to the top surface of the pyroelectric infrared sensor part.

10 Claims, 8 Drawing Sheets

(51) Int. Cl.
*G01J 5/02* (2006.01)
*G01J 5/08* (2006.01)
*G01J 5/00* (2006.01)
*G01J 5/34* (2006.01)
*H04N 1/00* (2006.01)
*G01J 5/06* (2006.01)

(52) U.S. Cl.
CPC .............. *G01J 5/046* (2013.01); *G01J 5/047* (2013.01); *G01J 5/0803* (2013.01); *G01J 5/089* (2013.01); *G01J 5/34* (2013.01); *H04N 1/00323* (2013.01); *G01J 2005/066* (2013.01)

(56) References Cited

U.S. PATENT DOCUMENTS

| | | | |
|---|---|---|---|
| 6,133,569 | A | 10/2000 | Shoda et al. |
| 2009/0091459 | A1* | 4/2009 | Stumpf ................. G08B 21/22 340/573.1 |
| 2011/0057106 | A1 | 3/2011 | Kimura et al. |
| 2011/0243162 | A1 | 10/2011 | Fujii et al. |
| 2012/0228503 | A1 | 9/2012 | Nishikawa et al. |
| 2015/0053859 | A1* | 2/2015 | Saito .......................... G01J 5/34 250/338.3 |
| 2015/0122999 | A1* | 5/2015 | Tsuchiya ................. H01L 37/02 250/338.3 |
| 2016/0138824 | A1* | 5/2016 | Patel ........................ F24F 11/30 700/276 |

FOREIGN PATENT DOCUMENTS

| | | |
|---|---|---|
| JP | H03-125934 A | 5/1991 |
| JP | H05-071994 U | 9/1993 |
| JP | H05-081669 U | 11/1993 |
| JP | H06-014934 U | 2/1994 |
| JP | H06-242226 A | 9/1994 |
| JP | H8-062342 A | 3/1996 |
| JP | H10-281864 A | 10/1998 |
| JP | 2001-304956 A | 10/2001 |
| JP | 2010-217012 A | 9/2010 |
| JP | 2011-058861 A | 3/2011 |
| JP | 2012-215396 A | 11/2012 |
| JP | 2013-205063 A | 10/2013 |
| WO | 2010074074 A | 7/2010 |

OTHER PUBLICATIONS

<http://www.nec-tokin.com/top/news.cgi?mode=body&id=233>, Apr. 19, 2016.
"Devices thru Material Innovation", NEC TOKIN Corporation, Techno-Frontier 2016, Apr. 20-22, 2016.
Dempa Publication, Inc. Apr. 26, 2016.
The Chemical Daily, May 30, 2016.
Office Action issued in corresponding Japanese Application No. 2016-142130 dated Sep. 24, 2019.
Office Action issued in corresponding Chinese Application No. 201710590960.1 dated May 6, 2020.
Office Action issued in corresponding Japanese Application No. 2016-142130 dated Jul. 7, 2020.
Office Action issued in corresponding Japanese Application No. 2016-142130 dated Nov. 24, 2020.

* cited by examiner

PYROELECTRIC INFRARED SENSOR DEVICE

INCORPORATION BY REFERENCE

This application is based upon and claims the benefit of priority from Japanese patent application No. 2016-142130, filed on Jul. 20, 2016, the disclosure of which is incorporated herein in its entirety by reference.

BACKGROUND

The present invention relates to a pyroelectric infrared sensor device.

A pyroelectric element is an element for detecting the light including infrared light by a pyroelectric effect. A pyroelectric infrared sensor device using the pyroelectric element has been developed.

Japanese Unexamined Patent Application Publication No. H8-062342, Japanese Unexamined Patent Application Publication No. H10-281864, and Japanese Unexamined Patent Application Publication No. 2010-217012 disclose a pyroelectric infrared sensor device comprising a pyroelectric element, a housing that the pyroelectric element is placed inside of and comprises an opening through which infrared light is incident on the pyroelectric element, an infrared transmission member which is located to cover the opening of the housing, and lenses that are located outside of the housing and condense infrared light on a light receiving surface of the pyroelectric element through the infrared transmission member.

Japanese Unexamined Patent Application Publication No. 2012-215396 discloses an infrared gas sensor comprising an infrared light source, an infrared sensor having a pyroelectric element, a printed substrate on the surface of which both the infrared light source and the infrared sensor are located, a dome type housing located in the upper part of the infrared light source and the infrared sensor, a concave type reflection surface provided on the surface of the dome type housing facing the infrared light source and the infrared sensor, and a gas duct through which gas passes placed between the printed substrate and the dome type housing.

SUMMARY

Because of the use of the lenses in the pyroelectric infrared sensor device disclosed in Japanese Unexamined Patent Application Publication No. H8-062342, Japanese Unexamined Patent Application Publication No. H10-281864, and Japanese Unexamined Patent Application Publication No. 2010-217012, there is a problem that it is difficult to achieve thinning of the pyroelectric infrared sensor device. Also in the infrared gas sensor disclosed in Japanese Unexamined Patent Application Publication No. 2012-215396, because of the use of the dome type housing, there is a problem that it is difficult to realize a thin type of the infrared gas sensor because of the thickness of the dome type housing.

In consideration of the problems mentioned above, a purpose of this invention is to achieve thinning of the pyroelectric infrared sensor device.

A pyroelectric infrared sensor device according to the present invention comprises a pyroelectric infrared sensor part and a cover member. In addition, the pyroelectric infrared sensor part comprises: a pyroelectric element; a housing that the pyroelectric element is placed inside of and comprises an opening at a position facing a light receiving surface of the pyroelectric element; and an infrared transmission filter that is located to cover the opening of the housing. In addition, the cover member covers at least a top surface of the pyroelectric infrared sensor part in a place where the cover member faces the infrared transmission filter of the pyroelectric infrared sensor part. In addition, the infrared transmission filter has a property to transmit light equal to or greater than a wavelength of 1 µm. In addition, the cover member has a property that a transmittance of infrared light having a wavelength of from 3 µm to 5.5 µm is equal to or greater than 10% and has a uniform material quality in an area corresponding to the top surface of the pyroelectric infrared sensor part.

In addition, it is preferable for the cover member to have a uniform material quality in an area twice as large as the size of field of view corresponding to an angle of view of the pyroelectric infrared sensor part.

In addition, it is more preferable for the cover member to have a uniform thickness in an area twice as large as the size of field of view corresponding to an angle of view of the pyroelectric infrared sensor part.

In addition, it is preferable for the cover member to block a visible light.

In addition, it is more preferable for a distance between the light receiving surface of the pyroelectric element and a surface of the infrared transmission filter that faces the pyroelectric element to be in a range of from 0.2 mm to 0.45 mm.

Furthermore, it is preferable that the pyroelectric element comprises: a pyroelectric substrate; and two electrodes that are arranged in parallel on the pyroelectric substrate, and that an infrared reflection film is formed on a surface of the infrared transmission filter that faces one of the two electrodes.

In addition, it is more preferable for the cover member to be formed of any one of high density polyethylene, glass, ABS resin, and acrylic resin, or a combination thereof.

According to the present invention, it is possible to achieve thinning of the pyroelectric infrared sensor device.

The above and other objects, features and advantages of the present invention will become more fully understood from the detailed description given hereinbelow and the accompanying drawings which are given by way of illustration only, and thus are not to be considered as limiting the present invention.

DESCRIPTION OF EMBODIMENTS

First Embodiment

Figure 1:
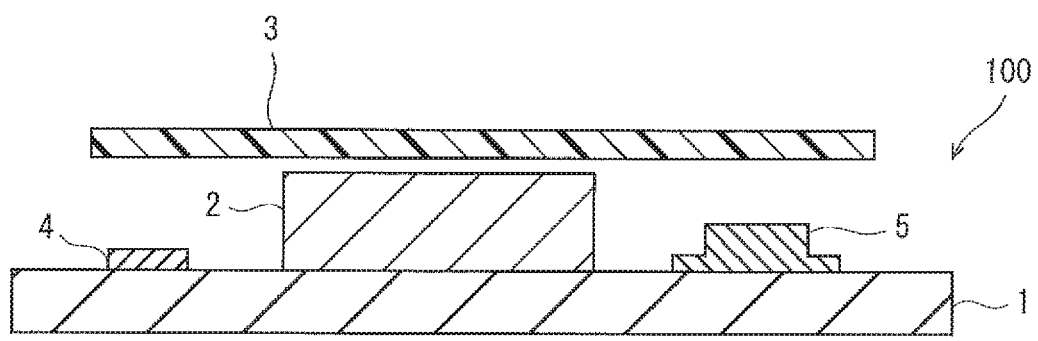
FIG. 1 is a cross section showing a pyroelectric infrared sensor device according to a first embodiment.
Figure 2:
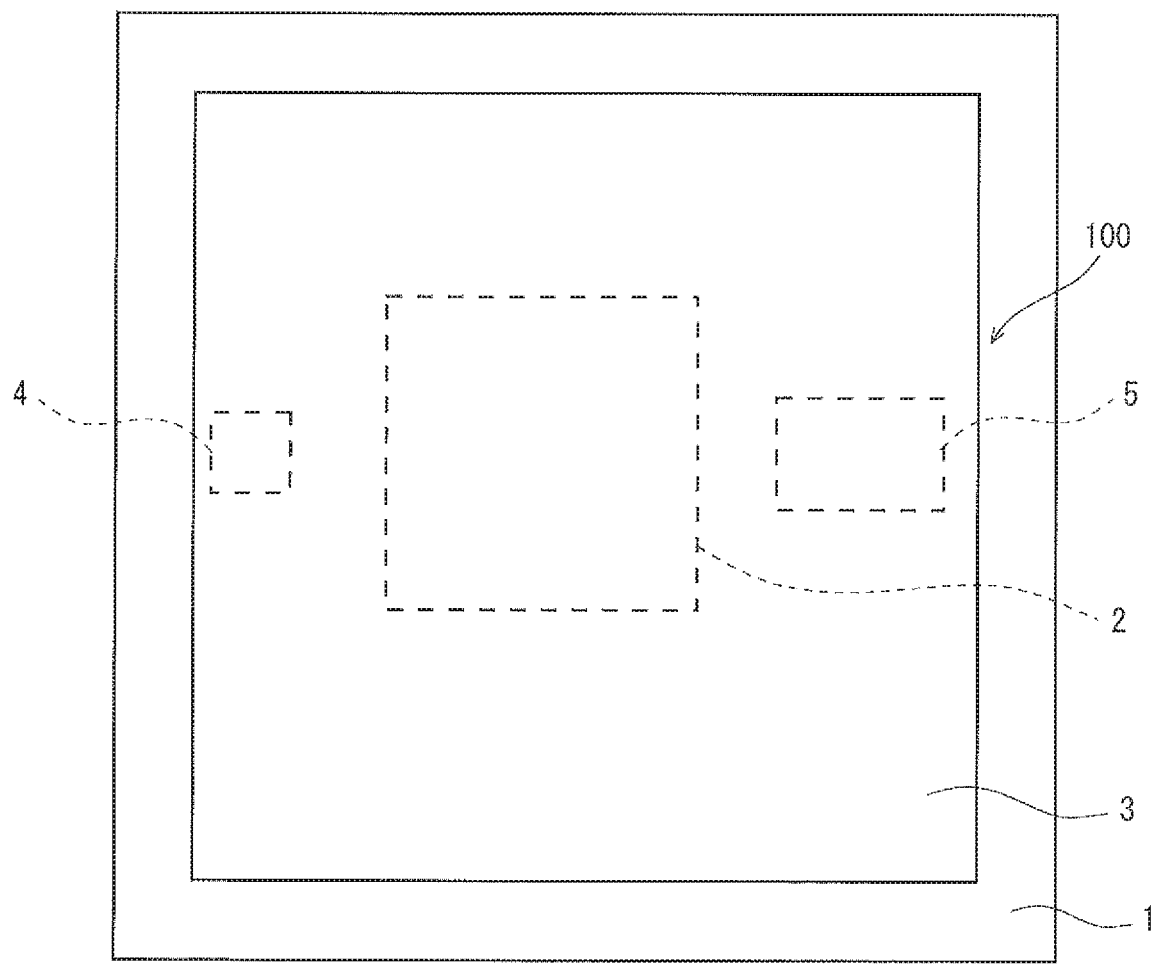
FIG. 2 is a floor plane showing the pyroelectric infrared sensor device according to the first embodiment.

The embodiment of the present invention will be described hereinafter with reference to drawings. FIG. 1 is a cross section showing a pyroelectric infrared sensor device 100 according to the first embodiment. FIG. 2 is a floor plane showing the pyroelectric infrared sensor device 100 according to the first embodiment. As shown in in FIG. 1 and FIG. 2, the pyroelectric infrared sensor device 100 according to the embodiment comprises a pyroelectric infrared sensor part 2 and a cover member 3. The pyroelectric infrared sensor device 100 is provided on a substrate 1. In addition, on the substrate 1, electronic parts 4, 5 other than the pyroelectric infrared sensor device 100 may be provided. It should be noted that the electronic parts 4, 5 are electronic parts mounted on an apparatus which the pyroelectric infrared sensor device 100 is also mounted on, and the electronic parts 4, 5 are not limited in particular. Furthermore, as shown in FIG. 2, the top surfaces of the electronic parts 4, 5 may be covered by the cover member 3 of the pyroelectric infrared sensor device 100. The electronic parts 4, 5 may also be mounted on the pyroelectric infrared sensor device 100. It should be noted that the use of the pyroelectric infrared sensor device 100 of the invention is not limited to detection of a human body, even though it is assumed that the pyroelectric infrared sensor device 100 according to the first embodiment is used as a sensor for human body detection.

As shown in FIG. 1, the pyroelectric infrared sensor part 2 and electronic parts 4, 5 are mounted on the substrate 1. As shown in FIG. 2, the top surfaces of the pyroelectric infrared sensor part 2 and electronic parts 4, 5 are covered by the cover member 3. It should be noted that the pyroelectric infrared sensor device 100 comprises a frame body (not shown), and the cover member 3 is supported on the substrate 1 by the frame body. In addition, the size of the frame body as viewed in a planar view should be a size large enough to enable at least the pyroelectric infrared sensor part 2 to be located inside of it, and it is not limited in particular. Similarly, the size (area) of the cover member 3 as viewed in a planar view should be a size large enough to enable the top surface of the pyroelectric infrared sensor part 2 to be covered, and it is not limited in particular. In addition, the cover member 3 may be integrally formed with the frame body. In other words, the cover member 3 may comprise a flat plate that shields an opening of the frame body and the frame body that has a size large enough to enable at least the pyroelectric infrared sensor part 2 to be located inside of it.

The substrate 1, for example, is an electronic circuit substrate such as a printed substrate. The substrate 1, for example, is a substrate used for the apparatus that the pyroelectric infrared sensor device 100 is mounted on, and the substrate 1 is not limited in particular.

Figure 3:
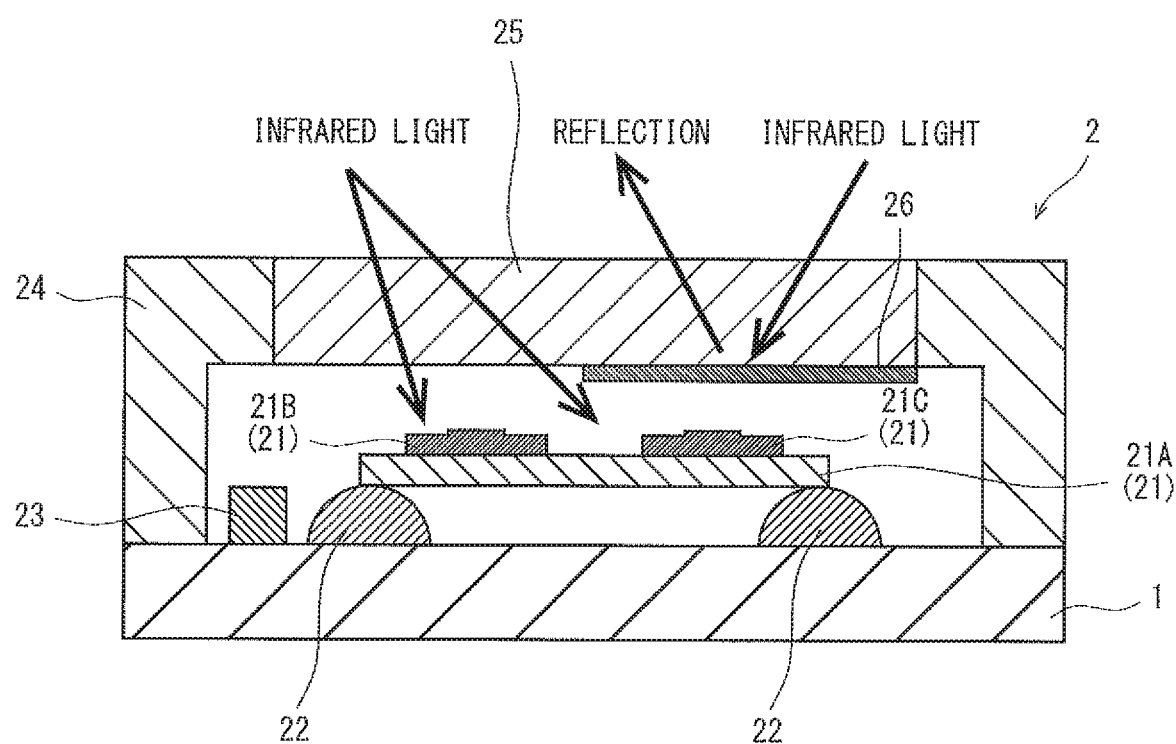
FIG. 3 is a cross section showing a pyroelectric infrared sensor part according to the first embodiment.

As shown in FIG. 3, the pyroelectric infrared sensor part 2 comprises a pyroelectric element 21, an electroconductive adhesive 22, a junction field effect transistor 23, a housing 24, an infrared transmission filter 25, an infrared reflection film 26, etc.

As shown in FIG. 3, the pyroelectric element 21 comprises a pyroelectric substrate 21A, a light receiving electrode 21B, and a temperature compensation electrode 21C.

For example, the pyroelectric substrate 21A is formed from ceramic having a property of spontaneous electric polarization, such as lead zirconate titanate (PZT).

The light-receiving electrode 21B and the temperature compensation electrode 21C are formed on a light receiving surface of the pyroelectric substrate 21A (a light receiving surface of the pyroelectric element 21). As shown in FIG. 3, the light-receiving electrode 21B and the temperature compensation electrode 21C are arranged in parallel on the pyroelectric substrate 21A. It should be noted that the light-receiving electrode 21B comprises a surface electrode formed on the light receiving surface of the pyroelectric substrate 21A and a rear-side electrode formed on a surface opposite to the light receiving surface of the pyroelectric substrate 21A; however the illustration of the rear-side electrode in FIG. 3 is omitted. Similarly, the temperature compensation electrode 21C comprises a surface electrode formed on the light receiving surface of the pyroelectric substrate 21A and a rear-side electrode formed on the surface opposite to the light receiving surface of the pyroelectric substrate 21A; however the illustration of the rear-side electrode in FIG. 3 is omitted.

In addition, the light receiving surface of the pyroelectric substrate 21A and the surface opposite to the light receiving surface are connected on the substrate 1 by the electroconductive adhesive 22 at predetermined points on edges of the surfaces.

The junction field effect transistor 23 is provided on the substrate 1. The rear-side electrode (not shown) of the light-receiving electrode 21B is connected to a gate input electrode of the junction field effect transistor 23. The rear-side electrode (not shown) of the temperature compensation electrode 21C is connected to a ground of the junction field effect transistor 23. An output signal of pyroelectric element 21 is inputted into the junction field effect transistor 23 through a G (Gate) terminal and the junction field effect transistor 23 executes an impedance conversion and outputs impedance conversion signals through S (Source) terminal.

The housing 24 is a frame body erected on the substrate 1. As shown in FIG. 3, the pyroelectric element 21 and the junction field effect transistor 23 are located inside of the frame body of the housing 24. The housing 24 includes an opening at a position facing the light receiving surface of the pyroelectric element 21 (the light receiving surface of the pyroelectric substrate 21A). In addition, the housing 24 is formed of an electrical insulating material which blocks, for example, infrared light having a wavelength of from 0.36 μm to 1 μm.

The infrared transmission filter 25 is located to cover the opening of the housing 24 mentioned above. In other words, the infrared transmission filter 25 covers the light receiving surface of at least the pyroelectric element 21 (the light receiving surface of the pyroelectric substrate 21A). In addition, for example, as a countermeasure against noises, an end part of the infrared transmission filter 25 may be adhered to the periphery of the opening of the housing 24, and one end of the housing 24 may be electrically connected to the ground.

An undersurface of the infrared transmission filter 25 faces the light-receiving electrode 21B in the pyroelectric substrate 21A and the temperature compensation electrode 21C. The infrared reflection film 26 is formed on the undersurface of the infrared transmission filter 25 at a position that faces the temperature compensation electrode 21C. In addition, a distance between the undersurface of the infrared transmission filter 25 and the light receiving surface of the pyroelectric substrate 21A is in a range of from 0.2 mm to 0.45 mm. This enables an angle of view of the pyroelectric infrared sensor part 2 to be a wide angle of view.

In addition, the infrared transmission filter 25 has a property to transmit light having a wavelength of from 1 μm to 14 μm. Furthermore, the infrared transmission filter 25 may have a property to transmit light having a wavelength of from 3 μm to 14 μm. The thickness of the infrared transmission filter 25 is not limited in particular, but, for example, is in a range of from 0.45 mm to 0.55 mm.

The infrared reflection film 26 is formed on the undersurface of the infrared transmission filter 25 at a position that faces the temperature compensation electrode 21C. This enables, as shown in FIG. 3, the angle of view of the pyroelectric infrared sensor part 2 to be a wide angle of view, while preventing infrared light from being incident in the temperature compensation electrode 21C. Here, the infrared reflection film 26 is, for example, formed on the undersurface of the infrared light transmission filter 25 with a thickness equal to or less than 1 μm by the sputtering or vacuum deposition methods in order to prevent the formation of the infrared reflection film 26 from affecting the height of the pyroelectric element 21. For example, a Ni film of 0.075 μm is formed on the undersurface of the infrared transmission filter 25 as the infrared reflection film 26. In addition, the infrared reflection film 26 may be formed in a vacuum deposition process for producing the infrared transmission filter 25 so that they are formed at the same time.

A thermal capacity of the infrared reflection film 26 is sufficiently smaller than a thermal capacity of the pyroelectric element 21. Therefore the influence that heat generated by infrared light being irradiated to the infrared reflection film 26 has on the pyroelectric element 21 is extremely small.

The infrared reflection film 26 may be formed on the undersurface of the infrared transmission filter 25 by the printing method, or one of the coating, transferring, and dipping processes. The infrared reflection film 26 may be formed on a surface of a thin plate and the thin plate may be cut in a predetermined shape and then attached to the undersurface of the infrared transmission filter 25. According to these methods, the infrared reflection film 26 can be formed on the undersurface of the infrared transmission filter 25 without using a large-scale production facility such as a sputtering equipment and a vacuum deposition device.

As shown in FIG. 1 and FIG. 2, the cover member 3 is located outside of the pyroelectric infrared sensor part 2 and covers at least the top surface of the pyroelectric infrared sensor part 2 in a place where the cover member 3 faces the infrared transmission filter 25. In addition, the cover member 3 has a substantially uniform thickness and a substantially uniform material quality in an area corresponding to the top surface of the pyroelectric infrared sensor part 2. The cover member 3 has a uniform material quality in an area twice as large as the size of field of view corresponding to the angle of view of the pyroelectric infrared sensor part 2.

Furthermore, the cover member 3 has a uniform thickness in an area twice as large as the size of field of view corresponding to the angle of view of the pyroelectric infrared sensor part 2. Here, "a uniform thickness" and "a uniform material quality" mean a thickness and a material quality such that infrared light quantity transmitted by the cover member 3 becomes substantially constant in the above area. It is preferable for the cover member 3 to have a thickness and a material quality such that a change of infrared light quantity transmitted by the cover member 3 is equal to or less than 10% in the area corresponding to the top surface of the pyroelectric infrared sensor part 2.

In addition, the cover member 3 has a property that a transmittance of infrared light having a wavelength of from 3 μm to 5.5 μm is equal to or greater than 10%. In addition, the cover member 3 has a property to block a visible light. In other words, the cover member 3 is formed by a material having a transmittance of infrared light having a wavelength of from 3 μm to 5.5 μm equal to or greater than 10% and blocking the visible light. It is preferable for the cover member 3 to be formed of any one of high density polyethylene (HDPE), glass ($SiO_2$), ABS resin, and acrylic resin. In addition, here, "the visible light" means light having a wavelength of from 0.36 μm to 1 μm and "blocking the visible light" means blocking light having a wavelength of from 0.36 μm to 1 μm.

As described above, in the pyroelectric infrared sensor device 100 according to the first embodiment, it is possible to produce the pyroelectric infrared sensor device 100 without using a lens as is done in the case of the conventional pyroelectric infrared sensor device. Therefore, it is possible to achieve thinning of the pyroelectric infrared sensor device 100. This may enables the pyroelectric infrared sensor device 100 to be superior in design and mountable on various apparatuses such as mobile devices such as a tablet PC or a smartphone, display unit such as a monitor or the PC, household appliances, a wireless remote controller and a mouse, and a non-contact switch.

In addition, the cover member 3 covers the top surface of at least the pyroelectric infrared sensor part 2 in a place where the cover member 3 faces the infrared transmission filter 25 of the pyroelectric infrared sensor part 2. In the conventional pyroelectric infrared sensor device using a lens, a position and the presence of the pyroelectric infrared sensor may be noticed because of the lens. In contrast, in the pyroelectric infrared sensor device 100 according to the first embodiment, because the cover member 3 covers the top surface of the pyroelectric infrared sensor part 2 without using the lens, it remains unperceived from outside of the pyroelectric infrared sensor device 100 that the pyroelectric infrared sensor part 2 is mounted on the pyroelectric infrared sensor device 100. Therefore, even if the pyroelectric infrared sensor part 2 is mounted on an apparatus used in the field of security such as crime prevention, it is hard for a person to recognize a position and presence of the pyroelectric infrared sensor part 2, and thus the pyroelectric sensor part 2 is suitable for achieving the purpose of crime prevention.

Furthermore, the infrared transmission filter 25 has a property to transmit light equal to or greater than a wavelength of 1 μm. Therefore it is possible for the infrared transmission filter 25 to transmit enough quantity of infrared light. This enables a temperature change of pyroelectric element 21 to become big and the sensitivity of the pyroelectric infrared sensor device 100 to be improved.

The cover member 3 has the property that the transmittance of infrared light having a wavelength of from 3 μm to 5.5 μm is equal to or greater than 10% and has the uniform thickness and the uniform material quality in the area corresponding to the top surface of the pyroelectric infrared sensor part 2. Specifically, the cover member 3 has the uniform material quality in the area twice as large as the size of field of view corresponding to the angle of view of the pyroelectric infrared sensor part 2. Furthermore, the cover member 3 has the uniform thickness in the area twice as large as the size of field of view corresponding to the angle of view of the pyroelectric infrared sensor part 2. This enables the cover member 3 to be used in substitution for a lens and a window transmitting infrared light in the pyroelectric infrared sensor device 100. Therefore there is no need to provide the lens and the window for the pyroelectric infrared sensor device 100. In addition, enough quantity of infrared light may be incident on the infrared transmission filter 25 by the cover member 3 having such a property. Therefore it is possible to keep sufficient level of sensitivity of the pyroelectric infrared sensor device 100.

In addition, the cover member 3 has a property to block a visible light. This enables preventing unnecessary light from being incident in the pyroelectric infrared sensor device 100.

The distance between the light receiving surface of the pyroelectric element 21 (the light receiving surface of the pyroelectric substrate 21A) and the surface of the infrared transmission filter 25 that faces the pyroelectric element 21 is in the range of from 0.2 mm to 0.45 mm. This enables an angle of view of the pyroelectric infrared sensor part 2 to be a wide angle of view. Therefore the position on the apparatus where the pyroelectric infrared sensor device 100 is mounted on and the flexibility of the design of the apparatus which the pyroelectric infrared sensor device 100 is mounted on improve.

The infrared reflection film 26 is formed on the undersurface of the infrared transmission filter 25 at the position facing the temperature compensation electrode 21C. This enables the angle of view of the pyroelectric infrared sensor part 2 to be a wide angle of view while preventing infrared light from being incident in the temperature compensation electrode 21C.

Figure 4:
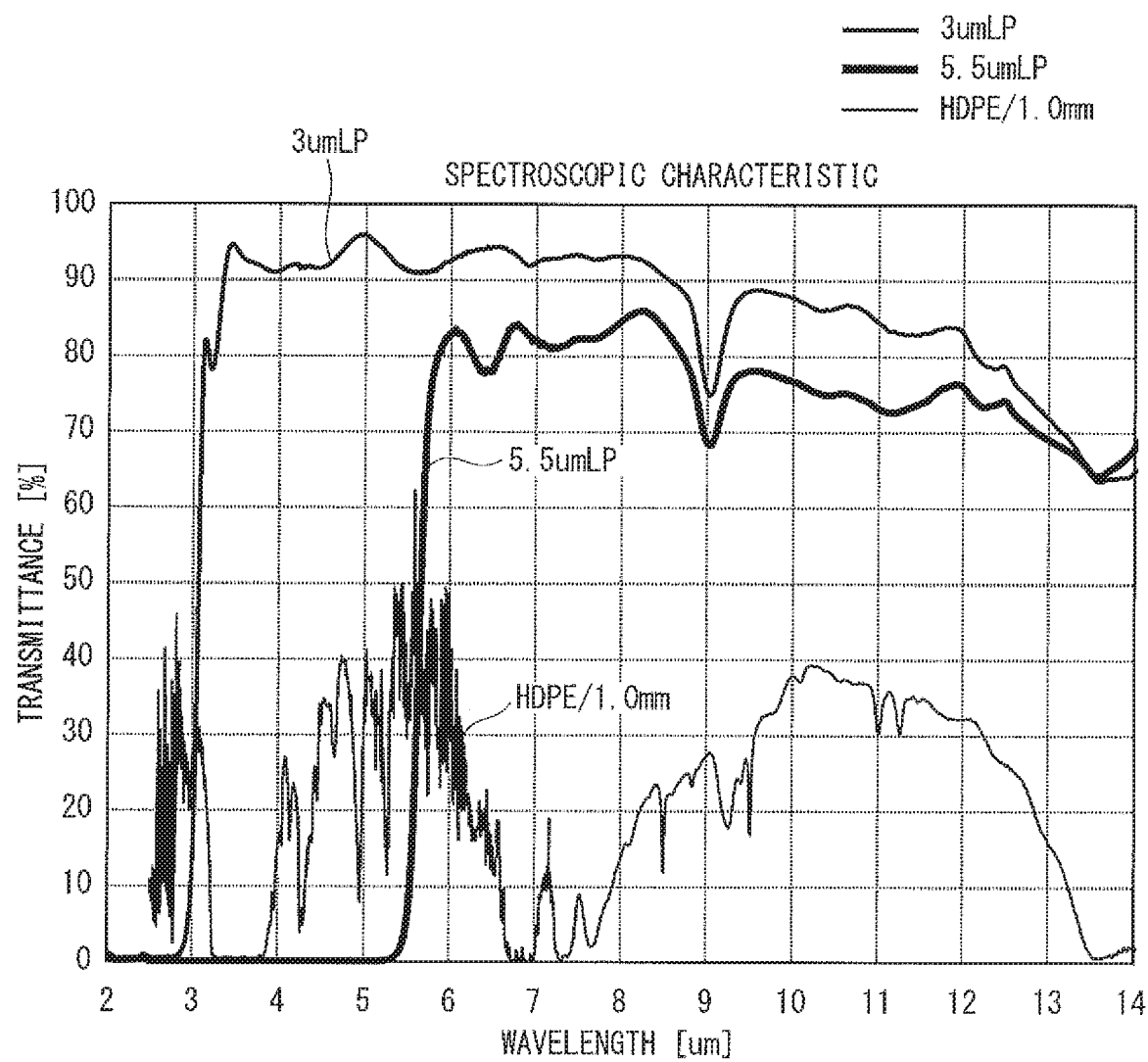
FIG. 4 is a graph showing a spectroscopic characteristic of a transmittance of a high density polyethylene as a cover member and an infrared transmission filter according to the first embodiment.
Figure 5:
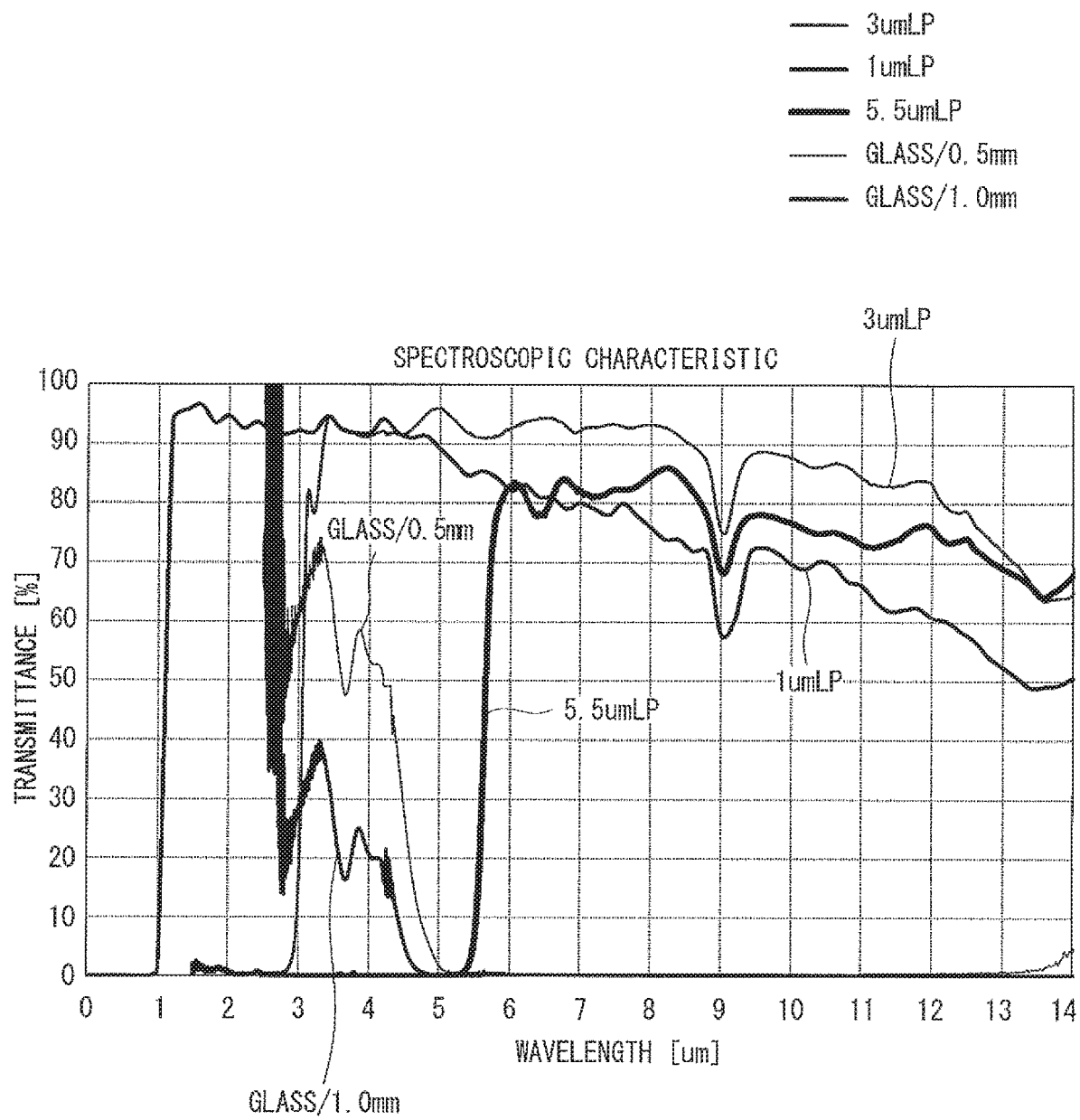
FIG. 5 is a graph showing a spectroscopic characteristic of a transmittance of a glass as a cover member and the infrared transmission filter according to the first embodiment.
Figure 6:
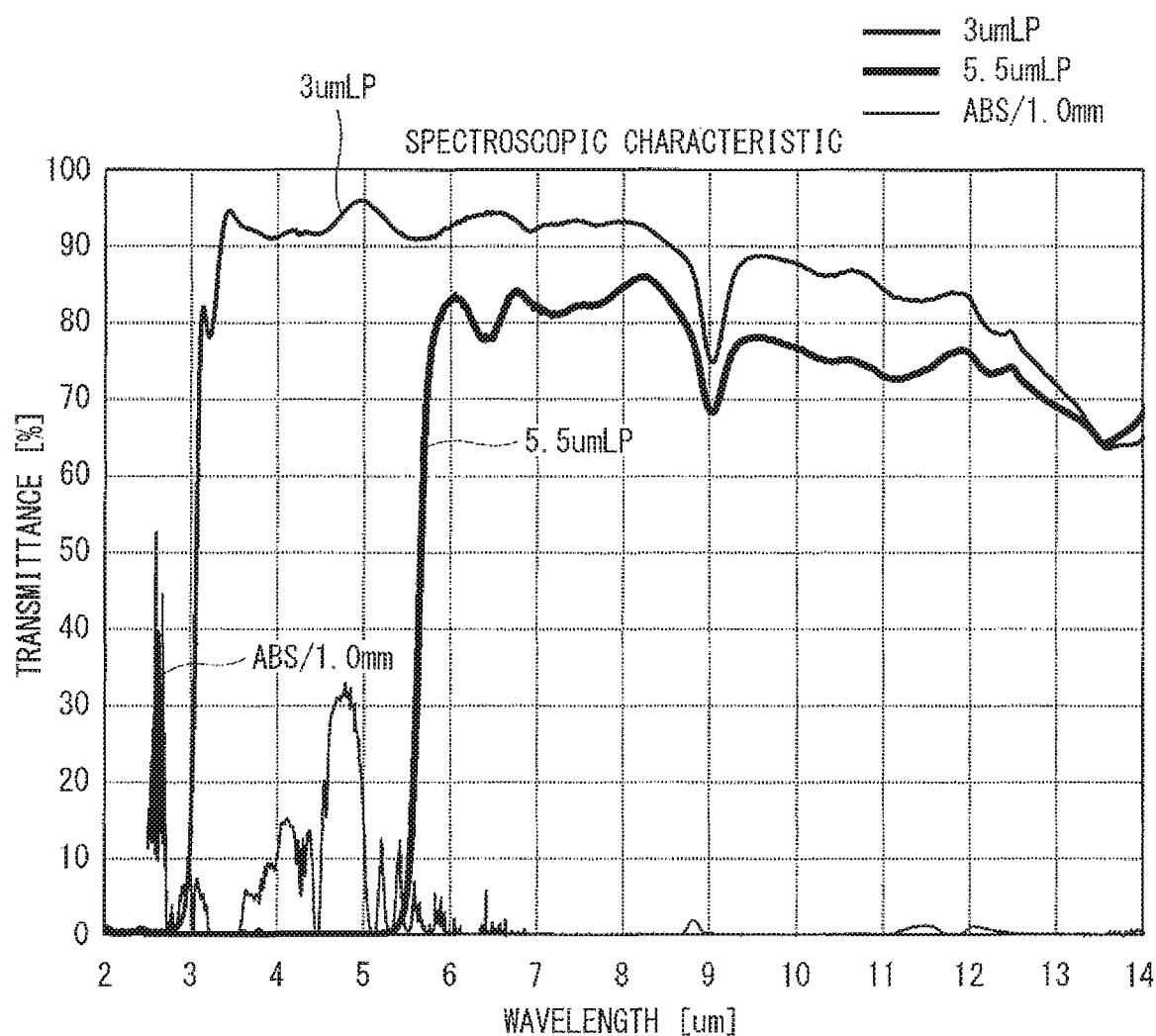
FIG. 6 is a graph showing a spectroscopic characteristic of a transmittance of an ABS resin as a cover member and the infrared transmission filter according to the first embodiment.
Figure 7:
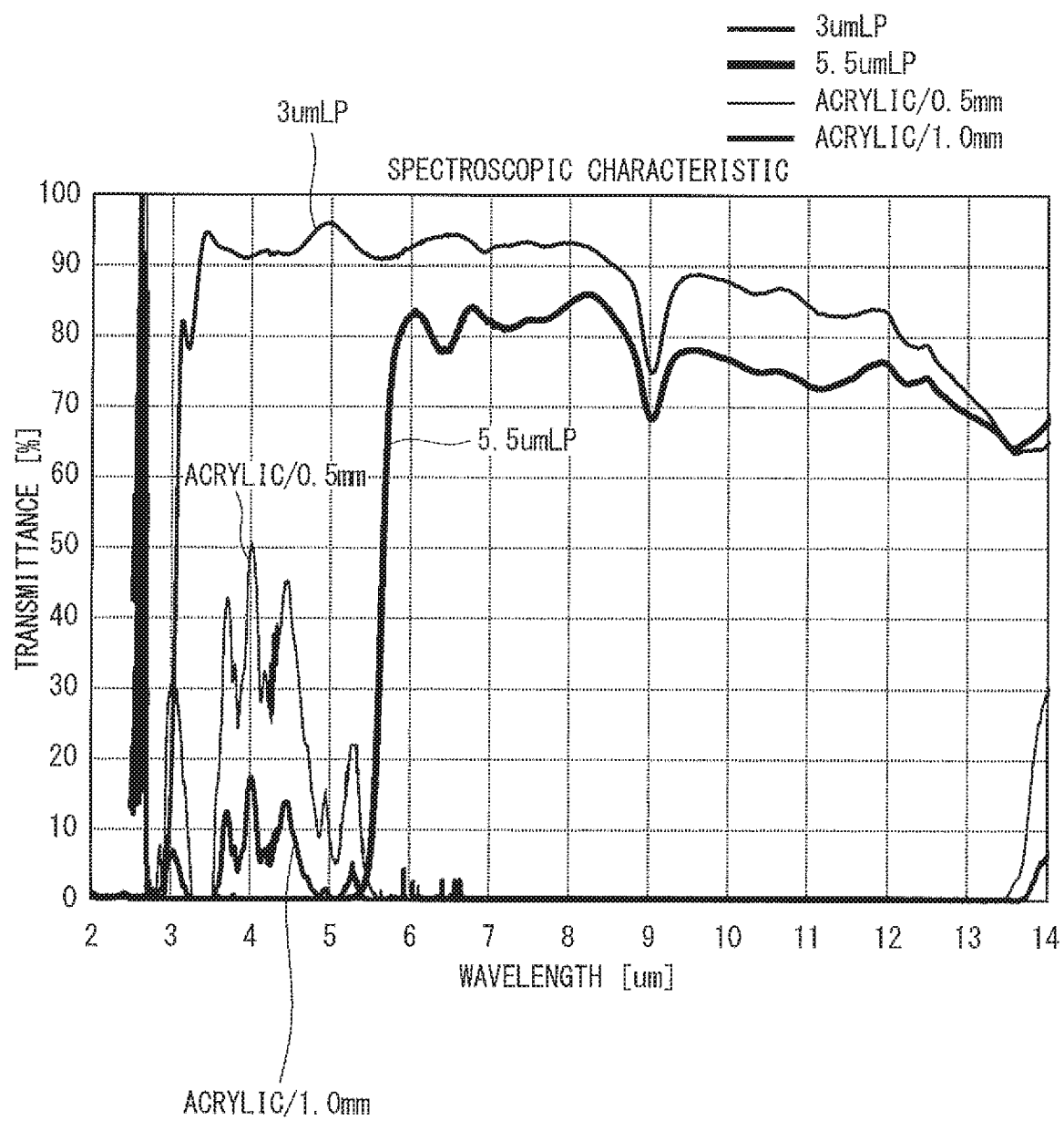
FIG. 7 is a graph showing a spectroscopic characteristic of a transmittance of an acrylic resin as a cover member and the infrared transmission filter according to the first embodiment.

Next, with reference to FIG. 4 to FIG. 7, spectroscopic characteristics of the transmittance of the cover member 3 and the infrared transmission filter 25 according to the present invention are described. FIG. 4 is a graph showing the spectroscopic characteristic of a transmittance of a high density polyethylene (thickness 1.0 mm) as the cover member 3 and a 3 μm long pass filter and a 5.5 μm long pass filter as the infrared transmission filter 25. FIG. 5 is a graph showing the spectroscopic characteristic of a transmittance of a glass (SiO$_2$, thickness 0.5 mm and 1.0 mm) as the cover member 3 and a 1 μm long pass filter, a 3 μm long pass filter, and a 5.5 μm long pass filter as the infrared transmission filter 25. FIG. 6 is a graph showing the spectroscopic characteristic of a transmittance of a ABS resin (thickness 1.0 mm) as the cover member 3 and a 3 μm long pass filter and a 5.5 μm long pass filter as the infrared transmission filter 25. FIG. 7 is a graph showing the spectroscopic characteristic of a transmittance of an acrylic resin (thickness 0.5 mm and 1.0 mm) as the cover member 3 and a 3 μm long pass filter and a 5.5 μm long pass filter as the infrared transmission filter 25.

In FIG. 4 to FIG. 7, a vertical axis shows transmittance (%), and the horizontal axis shows a wavelength (μm). In addition, the transmittance was measured using an open-type micro focus X-ray photofluoroscopic inspection apparatus made by Toshiba IT control systems Co., Ltd.

As shown in FIG. 4 to FIG. 7 it is understood that all of the high density polyethylene, the glass (SiO$_2$), the ABS resin, the acrylic resin used as materials for forming the cover member 3 transmit light having a wavelength of almost from 3 μm to 5.5 μm. As shown in FIG. 5, it is understood that the glass (SiO$_2$) transmits light having a wavelength of from 1 μm to 5.5 μm. In addition, it is understood that the 1 μm long pass filter as the infrared transmission filter 25 transmits light equal to or greater than a wavelength of about 1 μm. It is also understood that the 3 μm long pass filter as the infrared transmission filter 25 transmits light equal to or greater than a wavelength of about 3 μm. Furthermore, it is understood that the 5.5 μm long pass filter as the infrared transmission filter 25 transmits light equal to or greater than a wavelength of about 5.5 μm. As shown in FIG. 5 and FIG. 7, it is understood that the transmittance decreases when the thickness of cover member 3 increases.

EXAMPLES

Next, with reference to FIG. 8 to FIG. 11, examples of this invention are described.

This invention is explained concretely based on examples hereinafter, but this invention is not limited to only these examples. In addition, in each example, a blackbody furnace (product name "Blackbody" made by IR system Co., Ltd.) was used as a heat source. The temperature change amount (ΔT) of the blackbody furnace is 10° C. In each example, the simulation in which the pyroelectric infrared sensor device was moved at speeds of 0.5 m/s, 1.0 m/s, 1.5 m/s, and 2.0 m/s relative to the fixed blackbody furnace as the heat source was performed. The movement speed of 1.0 m/s is assumed to be a speed that a person walks and the movement speed of 2.0 m/s is assumed to be a speed that a person jogs. In addition, in each example, the output voltage 0.4(V0-p) was set for the detection limit voltage, and if the output voltage was equal to or greater than 0.4(V0-p), it was judged that the output voltage was detectable. In FIGS. 8 to 11, a vertical axis shows the output voltage (V0-p) of pyroelectric infrared sensor device 100, and a horizontal axis shows detection distance (mm). Here, the output voltage was detected voltage from 0V to maximum (maximum, amplitude level, V0-p). In addition, the detection limit voltage 0.4(V0-p), which is used as the threshold, is a value that may be changed according to the designs such as circuit designs for restraining the occurrence of noises.

Example 1

Figure 8:
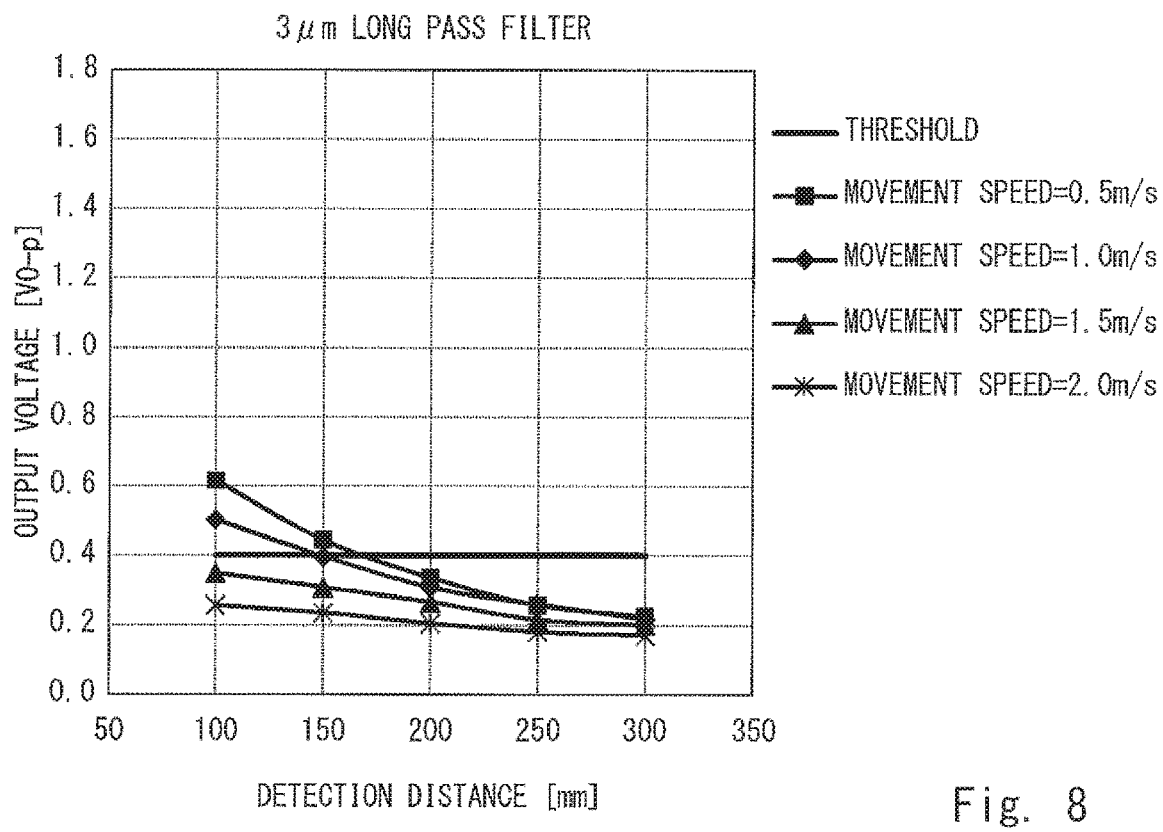
FIG. 8 is a graph showing the sensitivity of a pyroelectric infrared sensor device according to example 1.

In the pyroelectric infrared sensor device 100 according to example 1, the glass (SiO$_2$) of thickness 1.0 mm was used for the cover member 3. In addition, the 3 μm long pass filter was used for the infrared transmission filter 25. FIG. 8 shows sensitivity of the pyroelectric infrared sensor device 100 according to example 1.

Example 2

Figure 9:
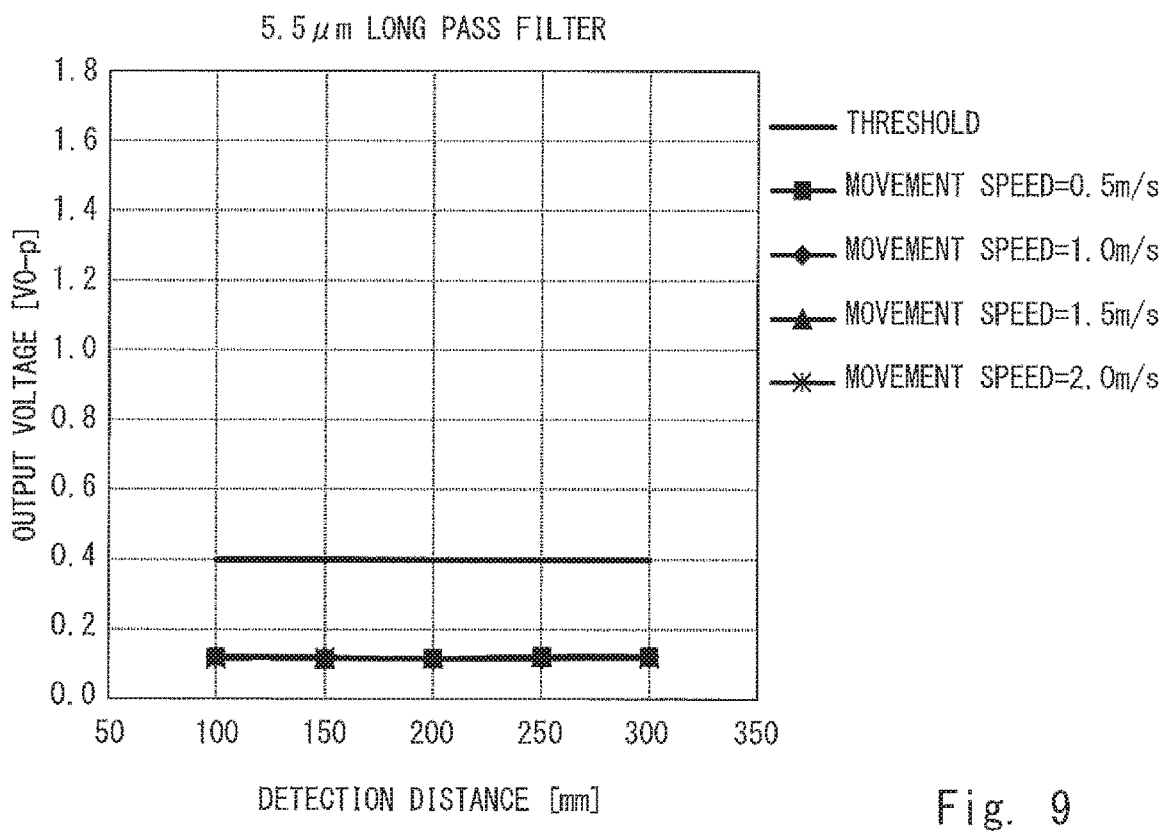
FIG. 9 is a graph showing the sensitivity of a pyroelectric infrared sensor device according to example 2.

In the pyroelectric infrared sensor device 100 according to example 2, the glass (SiO$_2$) of thickness 1.0 mm was used for the cover member 3. In addition, the 5.5 μm long pass filter was used for the infrared transmission filter 25. FIG. 9 shows sensitivity of the pyroelectric infrared sensor device 100 according to example 2.

Example 3

Figure 10:
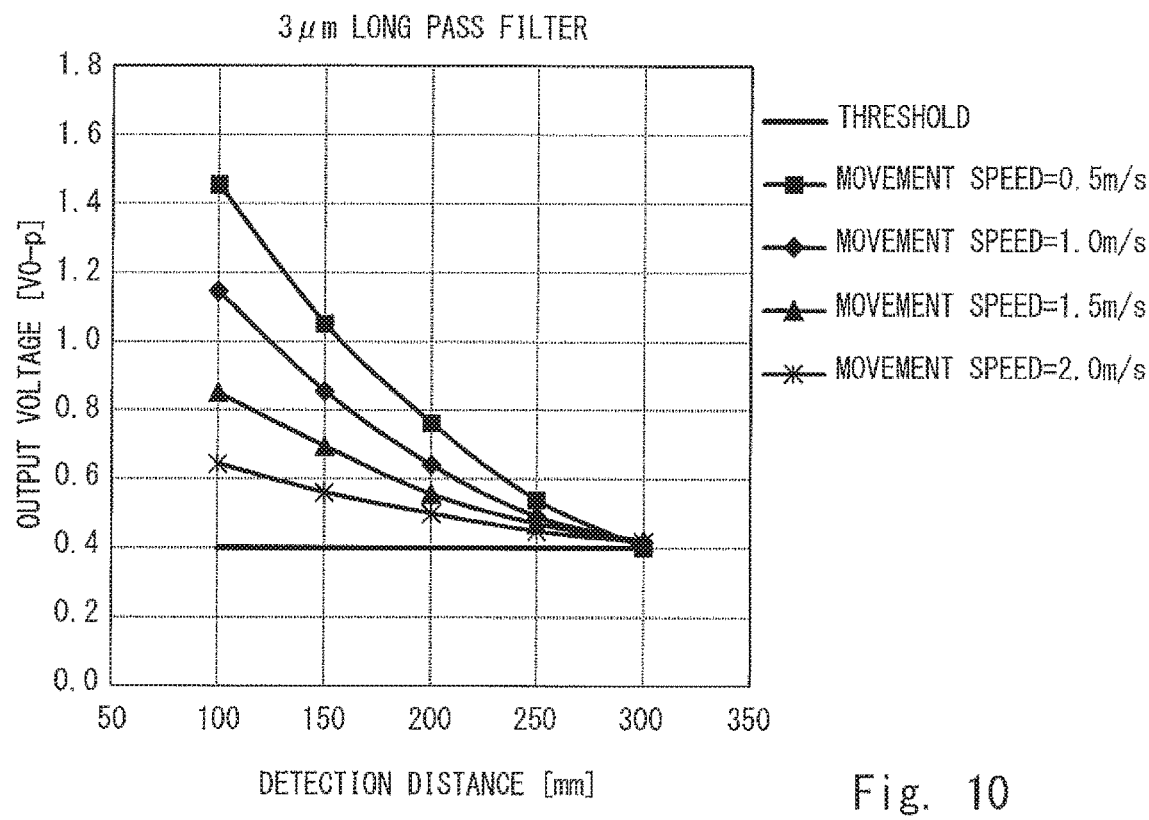
FIG. 10 is a graph showing the sensitivity of a pyroelectric infrared sensor device according to example 3.

In the pyroelectric infrared sensor device 100 according to example 3, the ABS resin of thickness 1.0 mm was used for the cover member 3. In addition, the 3 μm long pass filter was used for the infrared transmission filter 25. FIG. 10 shows sensitivity of the pyroelectric infrared sensor device 100 according to example 3.

Example 4

Figure 11:
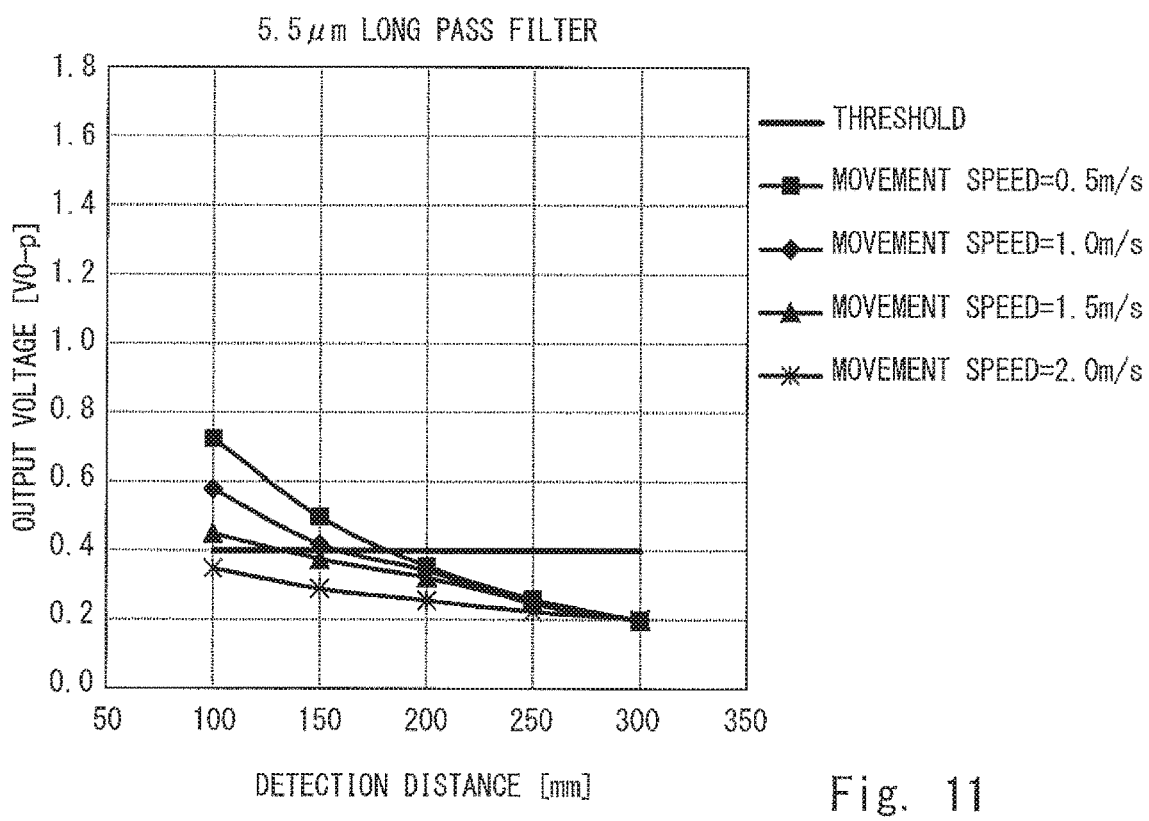
FIG. 11 is a graph showing the sensitivity of a pyroelectric infrared sensor device according to example 4.

In the pyroelectric infrared sensor device 100 according to example 4, the ABS resin of thickness 1.0 mm was used for the cover member 3. In addition, the 5.5 μm long pass filter was used for the infrared transmission filter 25. FIG. 11 shows sensitivity of the pyroelectric infrared sensor device 100 according to example 4.

From a comparison between FIG. 8 and FIG. 9, it is understood that in a case of using the 3 μm long pass filter for the infrared transmission filter 25, a range of the detection distance in which the output voltage (V0-p) of the pyroelectric infrared sensor device 100 becomes bigger than the threshold (0.4 (V0-p)) as the detection limit than in a case of using the 5.5 μm long pass filter for the infrared transmission filter 25 is wide. Specifically, the output voltage (V0-p) of the pyroelectric infrared sensor device 100 is lower than the detection limit in detection distances from 100 mm to 300 mm in the case of using the 5.5 μm long pass filter for the infrared transmission filter 25. On the other hand, the pyroelectric infrared sensor device 100 can detect the heat source moving at speeds of 0.5 m/s and 1.0 m/s in the detection distances of 100 mm and 150 mm in the case of using the 3 μm long pass filter for the infrared transmission filter 25.

Similarly, from a comparison between FIG. 10 and FIG. 11, it is understood that in a case of using the 3 μm long pass filter for the infrared transmission filter 25, a range of the detection distance in which the output voltage (V0-p) of the pyroelectric infrared sensor device 100 becomes bigger than the threshold (0.4 (V0-p)) as the detection limit than in a case of using the 5.5 μm long pass filter for the infrared transmission filter 25 is wide. Specifically, the pyroelectric infrared sensor device 100 can detect the heat source moving at speeds of 0.5 m/s, 1.0 m/s and 1.5 m/s in the detection distance of 100 mm and can detect the heat source moving at speeds of 0.5 m/s and 1.0 m/s in the detection distance of 150 mm in the case of using the 5.5 μm long pass filter for the infrared transmission filter 25. On the other hand, the pyroelectric infrared sensor device 100 can detect the heat source moving at speeds from 0.5 m/s to 2.0 m/s in the detection distances from 100 mm to 300 mm in the case of using the 3 μm long pass filter for the infrared transmission filter 25.

As described above, it is understood that in the case of using the 3 μm long pass filter for the infrared transmission filter 25 the detection sensitivity of the pyroelectric infrared sensor device 100 improves more than in the case of using the 5.5 μm long pass filter for the infrared transmission filter 25. It is considered that this is because the light quantity of infrared light transmitted by the 3 μm long pass filter is greater than the light quantity of infrared light transmitted by the 5.5 μm long pass filter. Therefore it is preferable that the infrared transmission filter 25 have a property to transmit light equal to or greater than a wavelength of 3 μm. Furthermore, it is preferable that the infrared transmission filter 25 have a property to transmit light equal to or greater than a wavelength of 1 μm.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A pyroelectric infrared sensor device comprising:
a pyroelectric infrared sensor part; and
a cover member located outside of the pyroelectric infrared sensor part, wherein
the pyroelectric infrared sensor part includes:
a pyroelectric element,
a housing that the pyroelectric element is placed inside of and comprises an opening at a position facing a light receiving surface of the pyroelectric element, and
an infrared transmission filter that is located to cover the opening of the housing,
the cover member covers at least a top surface of the pyroelectric infrared sensor part and a gap exists between the cover member and the pyroelectric infrared sensor part in a place where the cover member faces the infrared transmission filter of the pyroelectric infrared sensor part,
the infrared transmission filter has a property to transmit light equal to or greater than a wavelength of 1 μm,
the cover member has a property that a transmittance of infrared light having a wavelength of from 3 μm to 5.5 μm is equal to or greater than 10% and has a uniform material quality in an area corresponding to the top surface of the pyroelectric infrared sensor part, and
the cover member is formed of a material that blocks visible light.

2. The pyroelectric infrared sensor device according to claim 1, wherein the cover member has a uniform material quality in an area twice as large as a size of a field of view corresponding to an angle of view of the pyroelectric infrared sensor part, and
the cover member includes a flat plate having a size at least equal to an area twice as large as the size of the field of view corresponding to the angle of view of the pyroelectric infrared sensor part.

3. The pyroelectric infrared sensor device according to claim 2, wherein the cover member has a uniform thickness in an area twice as large as the size of the field of view corresponding to an angle of view of the pyroelectric infrared sensor part.

4. The pyroelectric infrared sensor device according to claim 1, wherein a distance between the light receiving surface of the pyroelectric element and a surface of the infrared transmission filter that faces the pyroelectric element is in a range of from 0.2 mm to 0.45 mm.

5. The pyroelectric infrared sensor device according to claim 1, wherein the pyroelectric element includes:
a pyroelectric substrate; and
two electrodes that are arranged in parallel on the pyroelectric substrate, and
an infrared reflection film is formed on a surface of the infrared transmission filter that faces one of the two electrodes.

6. The pyroelectric infrared sensor device according to claim 1, wherein the cover member is formed of any one of high density polyethylene, glass, ABS resin, or acrylic resin, or a combination thereof.

7. A pyroelectric infrared sensor device comprising:
a pyroelectric infrared sensor part which includes a housing, a pyroelectric element placed in the housing, and an infrared transmission filter; and a cover member which covers at least a top surface of the pyroelectric infrared sensor part, facing the infrared transmission filter, wherein the housing has an opening at a position facing a light receiving surface of the pyroelectric element, the infrared transmission filter covers the opening, the infrared transmission filter has a property to transmit light equal to or greater than a wavelength of 1 μm, the cover member has a property that a transmittance of infrared light having a wavelength of from 3 μm to 5.5 μm is equal to or greater than 10% and has a uniform material quality in an area corresponding to the top surface of the pyroelectric infrared sensor part, and the cover member is formed of a material that blocks visible light.

8. The pyroelectric infrared sensor device according to claim 1, wherein a quantity of the infrared light transmitted through the cover member is substantially constant in the area corresponding to the top surface of the pyroelectric infrared sensor part.

9. The pyroelectric infrared sensor device according to claim 7, wherein a quantity of the infrared light transmitted through the cover member is substantially constant in the area corresponding to the top surface of the pyroelectric infrared sensor part.

10. A pyroelectric infrared sensor device comprising:

a pyroelectric infrared sensor part; and a cover member located outside of the pyroelectric infrared sensor part, wherein the pyroelectric infrared sensor part includes:

a pyroelectric element, a housing in which the pyroelectric element is placed, wherein the housing comprises an opening at a position facing a light receiving surface of the pyroelectric element, and an infrared transmission filter that is located to cover the opening of the housing, wherein the cover member covers at least a top surface of the pyroelectric infrared sensor part at a location where the cover member faces the infrared transmission filter of the pyroelectric infrared sensor part, the infrared transmission filter has a property to transmit light equal to or greater than a wavelength of 1 μm, the cover member has a property that a transmittance of infrared light having a wavelength of from 3 μm to 5.5 μm is equal to or greater than 10% and has a uniform material quality in an area corresponding to the top surface of the pyroelectric infrared sensor part, the cover member is formed of a material blocking visible light, and the cover member has a uniform material quality in an area twice as large as the size of field of view corresponding to an angle of view of the pyroelectric infrared sensor part.

* * * * *